United States Patent [19]

Fujiwara et al.

[11] Patent Number: 4,468,582
[45] Date of Patent: Aug. 28, 1984

[54] PIEZOELECTRIC RESONATOR CHIP AND TRIMMING METHOD FOR ADJUSTING THE FREQUENCY THEREOF

[75] Inventors: Yoshiro Fujiwara, Kawasaki; Yuji Kojima, Chigasaki; Sumio Yamada, Kawasaki; Hiroshi Hoshino, Kawasaki; Noboru Wakatsuki, Kawasaki, all of Japan

[73] Assignee: Fujitsu Limited, Kawasaki, Japan

[21] Appl. No.: 486,532

[22] Filed: Apr. 19, 1983

[30] Foreign Application Priority Data

| | | | |
|---|---|---|---|
| Apr. 20, 1982 | [JP] | Japan | 57-65946 |
| Apr. 20, 1982 | [JP] | Japan | 57-65948 |
| Apr. 28, 1982 | [JP] | Japan | 57-72448 |

[51] Int. Cl.³ .................................. H01L 41/08
[52] U.S. Cl. .................................. 310/312; 310/364; 310/365; 310/366
[58] Field of Search ............... 310/312, 363–366, 310/370; 29/25.35

[56] References Cited

U.S. PATENT DOCUMENTS

| | | | |
|---|---|---|---|
| 4,259,607 | 3/1981 | Noguchi et al. | 310/364 |
| 4,418,299 | 11/1983 | Momosaki | 310/312 X |

FOREIGN PATENT DOCUMENTS

| | | | |
|---|---|---|---|
| 0032695 | 3/1977 | Japan | 310/370 |
| 0068191 | 6/1978 | Japan | 310/370 |
| 0132187 | 10/1979 | Japan | 310/364 |
| 0115710 | 9/1980 | Japan | 310/312 |
| 2072943 | 10/1981 | United Kingdom | 310/370 |

OTHER PUBLICATIONS

Protective Coatings Against Corrosion in Metal Electrodes, by J. E. Ordones, IBM Technical Disclosure Bulletin, vol. 15, No. 4, Sep. 1972, p. 1088.

*Primary Examiner*—Mark O. Budd
*Attorney, Agent, or Firm*—Staas & Halsey

[57] ABSTRACT

A piezoelectric resonator chip which includes a piezoelectric chip plate and a pair of electrode patterns which is formed on the opposite surfaces of the piezoelectric chip plate, the electrode patterns face each other through the piezoelectric chip plate. At least one of the electrode patterns has an adjuster pattern which includes a narrow cutting pattern and a separation pattern which is connected to the electrode pattern through the cutting pattern and which faces the other electrode pattern.

9 Claims, 16 Drawing Figures

Fig. 16

PIEZOELECTRIC RESONATOR CHIP AND TRIMMING METHOD FOR ADJUSTING THE FREQUENCY THEREOF

BACKGROUND OF THE INVENTION (1) Field of the Invention

The present invention relates to a strip-type piezoelectric resonator chip and to a method of trimming the resonator chip to adjust the frequency thereof.

Piezoelectric resonators comprise a chip of piezoelectric material, such as crystal or lithium tantalate (LiTaO$_3$), on which a pair of electrodes is formed. When an alternating current electric field is applied between the electrodes, the piezoelectric chip is subject to the stress of a frequency equal to that of the alternating current electric field. When the frequency of the alternating current electric field coincides with the inherent resonant frequency of the piezoelectric chip, electric resonance occurs, resulting in greater oscillation of the piezoelectric chip. Oscillating devices comprising such piezoelectric resonators are widely used in oscillators or filters of communication apparatuses because of their compactness and high reliability.

(2) Description of the Prior Art

A piezoelectric chip is cut from a plate of a single crystal (a wafer) and a pair of electrode patterns is coated on the two main surfaces of the chip plate, the electrode patterns face each other through the chip plate. It is difficult to obtain a chip of a desired resonant frequency by such a process of production of the chip. Therefore, a process for adjusting the resonant frequency is required. In the process for adjusting the resonant frequency according to the prior art, metal is added to the electrode patterns by a plating method or evaporation method so as to increase the mass of the electrodes. If the plating method is used, the plating process is repeated many times and the frequency of the chip is measured until a desired frequency is obtained. If the evaporation method is used, the thickness of the electrodes is increased and the frequency of the chip which is housed within the bell jar of the evaporation device is measured until a desired frequency is obtained. However, in this prior art method, the adjusting process is troublesome and the adjustable frequency range is small.

SUMMARY OF THE INVENTION

The present invention takes the above drawbacks of the prior art into consideration. It is an object of the present invention to provide a piezoelectric resonator chip in which it is possible to easily adjust the resonant frequency thereof and which has a wide, adjustable frequency range.

A method for adjusting the frequency of a piezoelectric resonator chip, in accordance with the present invention, comprises a piezoelectric chip plate and a pair of electrode patterns which are formed on opposite surfaces of the piezoelectric chip plate. The electrode patterns face each other through the piezoelectric chip plate and a laser beam is irradiated on each of the electrode patterns so as to separate a part of the electrode patterns.

A piezoelectric resonator chip to which the method of the present invention can be suitably applied comprises a piezoelectric chip plate and a pair of electrode patterns which are formed on opposite surfaces of the piezoelectric chip plate, the electrode patterns facing each other through the piezoelectric chip plate. At least one of the electrode patterns has an adjuster pattern comprising a narrow cutting pattern and a separation pattern which is connected to the electrode pattern through the cutting pattern and which faces the other electrode pattern. The resonant frequency is adjusted by cutting the cutting pattern so as to electrically separate the separation pattern from the electrode pattern.

DESCRIPTION OF THE PREFERRED EMBODIMENTS

Figure 1:
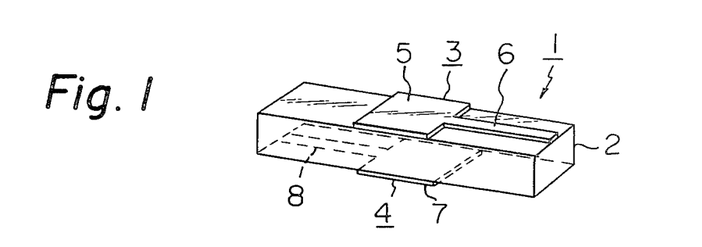
FIG. 1 is a perspective view of a strip-type piezoelectric resonator chip before frequency adjustment, in accordance with a method of the present invention.

In FIG. 1, a resonator chip 1, comprising a piezoelectric chip plate 2 of a single crystal of lithium tantalate, is illustrated. The resonator chip 1 has not yet been trimmed to adjust the frequency. T shaped electrode patterns 3 and 4 are coated on the opposed two main surfaces (upper and lower surfaces) of the piezoelectric chip plate 2 by an evaporation method. The electrode pattern 3 comprises a main portion 5 disposed at the center of the piezoelectric chip plate 2 and a connecting portion 6 extending toward the right end of the piezoelectric chip plate 2. The width of the main portion 5 is equal to the width of the piezoelectric chip plate 2. The length of the main portion 5 is somewhat longer than the designed length which corresponds to a frequency to be generated by the resonator chip 1. The electrode pattern 4, which has a shape similar to that of the electrode pattern 3, comprises a main portion 7 and a connecting portion 8 which extends from the main portion 7 toward the left end of the piezoelectric chip plate 2. In order to adjust the frequency of the resonator chip 1, part of the main portions 5 and 7 of the electrode patterns 3 and 4, respectively, is removed by a laser trimming method in which a laser beam is irradiated on the electrode patterns to be removed.

Figure 2:
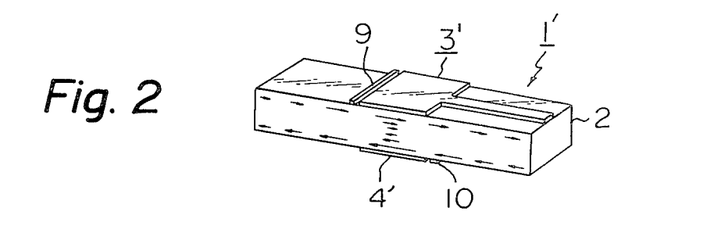
FIG. 2 is a perspective view of the piezoelectric resonator chip of FIG. 1, showing the state thereof after frequency adjustment.
Figure 3:
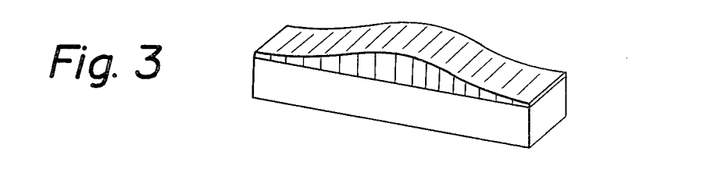
FIG. 3 is a diagram of the piezoelectric resonator chip of FIG. 1 showing the magnitude of oscillation thereof.

In FIG. 2, the electrode patterns 3' and 4' of the resonator chip 1' are formed by separating a part 9 from the electrode pattern 3 and a part 10 from the electrode pattern 4 by the laser trimming method so as to obtain a desired frequency. A thickness shear oscillation of a desired frequency, indicated by the arrows, is generated in the resonator chip 1' when a predetermined voltage of a high frequency is applied between the pair of electrode patterns 3' and 4'. The magnitude of the oscillation is maximum at the center of the resonator chip 1' and gradually decreases toward the ends of the resonator chip 1', as is shown in FIG. 3.

Adjusting the frequency of the resonator chip can be easily done by trimming the electrode patterns by irradiating a laser beam thereupon.

However, in the above method of trimming the electrode by using a laser beam, at the time of separating the part 9 from the electrode pattern 3, the laser beam sometimes penetrates the piezoelectric chip plate 2 and cuts the electrode pattern 4 disposed on the opposite surface of the piezoelectric chip plate 2, with the result that the connecting portion 8 is separated from the main portion of the electrode pattern 4'.

Figure 4:
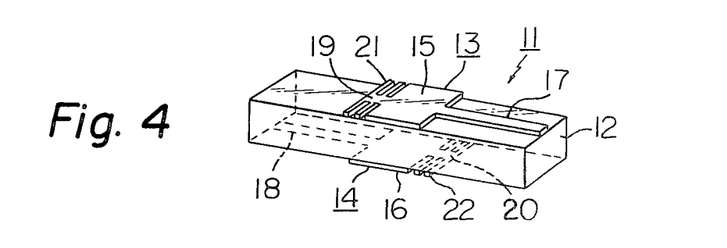
FIG. 4 is a perspective view of another strip-type piezoelectric resonator chip before frequency adjustment, in accordance with the method of the present invention.

An example of a resonator chip to which a trimming method without the above mentioned drawbacks can be applied is illustrated in FIG. 4.

A pair of electrode patterns 13 and 14 is formed on the opposite two main surfaces of the piezoelectric chip plate 12 of the strip-type resonator chip 11. The electrode patterns 13 and 14, respectively, comprise: main portions 15 and 16 which are disposed at the center portion of the piezoelectric chip plate 12 and have a width equal to that of the piezoelectric chip plate 12; connecting portions 17 and 18 which extend from the main portion toward the right or left end of the piezoelectric chip plate 12 and connect with a terminal (not shown); and comb-shaped adjuster electrodes 21 and 22 which have connecting bridges 19 and 20 at the center of the teeth of the comb. In the trimming process, the connecting bridge 19 or 20 of the comb-shaped electrode 21 or 22 is cut with a laser beam. During this trimming process, a high frequency voltage is applied between the pair of electrode patterns 13 and 14 and the frequency of oscillation of the resonator chip 11 is measured. The cutting portion of the connecting bridges 19 and 20 of the comb-shaped electrodes 21 and 22 is determined in accordance with the measured frequency so that it coincides with the design frequency to be generated. Also, a part of the main portion 15 or 16 of the electrode patterns 13 or 14 is removed with a laser beam so as to precisely adjust the frequency, if necessary, in addition to the rough adjustment of the frequency by cutting the comb-shaped adjuster electrode.

Figure 5:
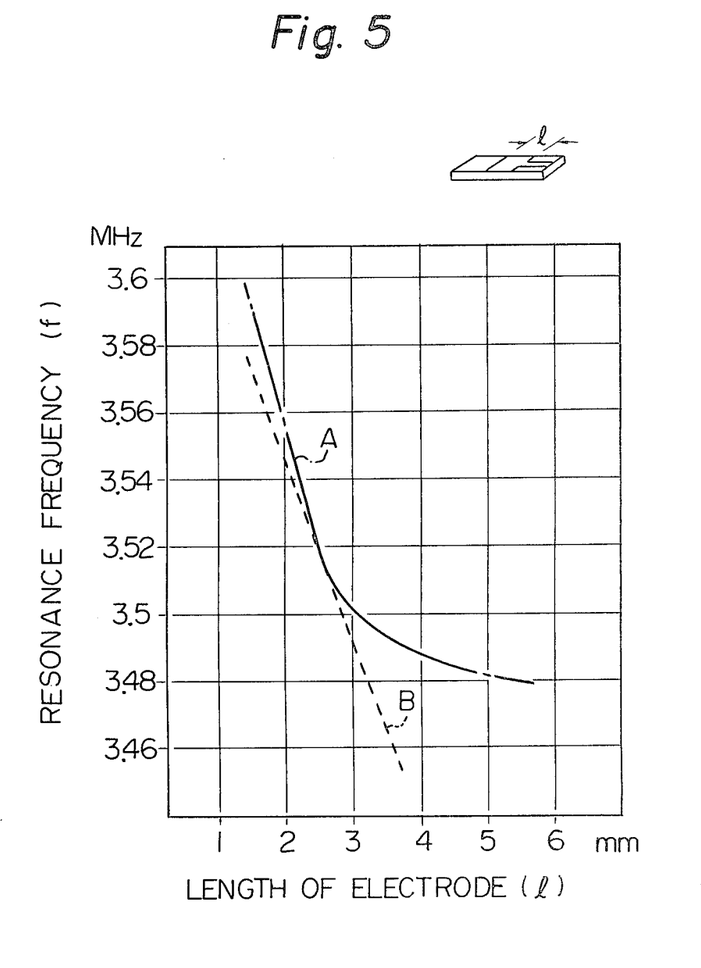
FIG. 5 is a graph of the resonant frequency of a strip-type piezoelectric resonator chip of lithium tantalate with respect to the length of the main portion of the electrode pattern.

FIG. 5 is a graph showing an experimental result, represented by the curve A. The curve A represents the resonant frequency (f) with respect to the length (l) of the main portion of the T shaped electrode pattern formed on each of the opposed two main surfaces of a piezoelectric chip plate of lithium tantalate having an 8 mm length, a 2 mm width, and a 565 $\mu$m thickness. In FIG. 5, the abscissa represents the length l (mm) of the electrode main portion and the ordinate represents the resonant frequency f (MHz). If the length (l) is 2.5 mm, the resonant frequency (f) of the resonator chip is about 3.52 MHz. The rate of frequency change at this point is represented by the broken line B. If the length (l) is decreased by 1 $\mu$m, the frequency f decreases by about 54 Hz. The rate of frequency change is lowered when the length (l) is long. However, a frequency of several KHz can be easily adjusted in a resonator chip of about 3.5 MHz.

Figure 6:
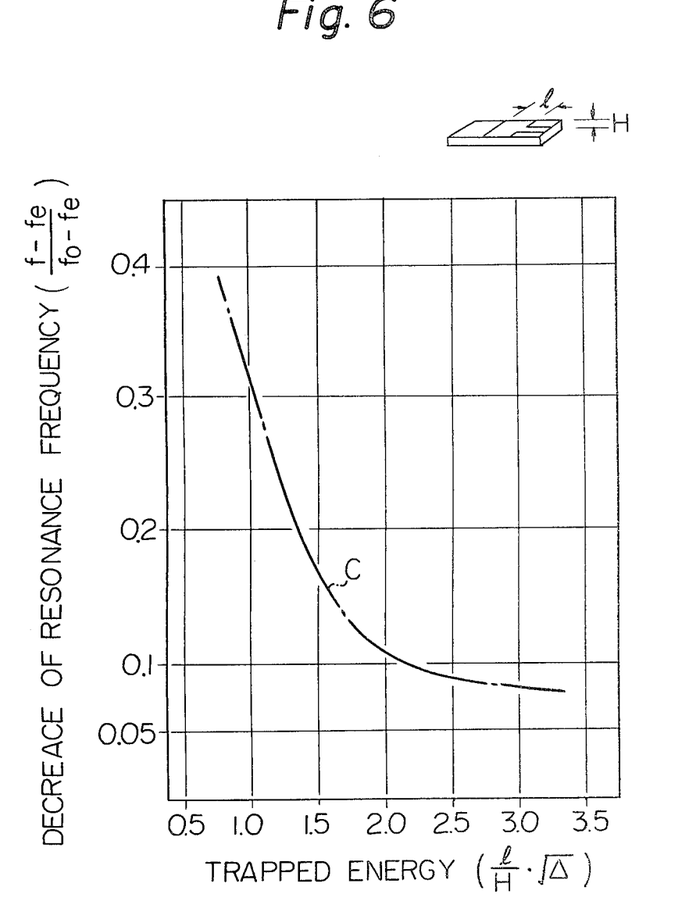
FIG. 6 is a graph of a decrease of resonant frequency with respect to the trapped energy of the strip-type piezoelectric resonator chip.

FIG. 6 is a graph showing an experimental result represented by the curve C. The curve C represents a decrease of the resonant frequency with respect to the trapped energy of a piezoelectric chip plate of lithium tantalate having an 8 mm length, a 2 mm width, and a 0.565 $\mu$m thickness.

The decrease rate ($\Delta$) of the frequency is represented by $$(f_o - f_e) \cdot f_o^{-1},$$

the decrease of the resonant frequency is represented by $$(f - f_e) \cdot (f_o - f_e)^{-1},$$

and the trapped energy of the resonator chip is represented by $$l \cdot \sqrt{\Delta} \cdot H$$

in which: l is the length of the main portion of the electrode pattern formed on the piezoelectric chip plate;

H is the thickness of the piezoelectric chip plate;

f is the resonant frequency of the resonator chip which has an electrode main portion having a length l;

$f_e$ is the resonant frequency of the resonator chip, the electrode main portion of which extends over the entire length of the piezoelectric chip plate; and $f_o$ is the inherent resonant frequency of the resonator chip.

A piezoelectric chip plate of crystal has a small coefficient of electromechanical coupling. The decrease rate ($\Delta$) of the resonant frequency of such a chip plate of crystal is below 0.2% since the value of ($f_o - f_e$) is small. Therefore, the amount of frequency change in response to the change of the surface area of the electrode main portion is small. On the other hand, the coefficient of electromechanical coupling of a piezoelectric chip plate of lithium tantalate (LiTaO$_3$) or lithium niobate (LiNbO$_3$) is large. Therefore, the decrease rate ($\Delta$) of the resonant frequency is large (about 10%). Accordingly, the amount of frequency change in response to the change of the surface area of the electrode main portion is large so that the frequency can be easily adjusted by changing the surface area of the electrode main portion.

Figure 7:
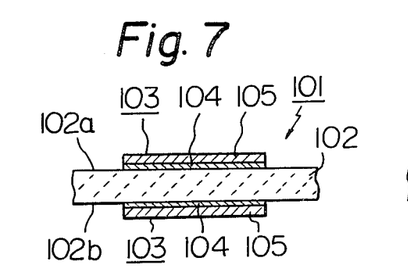
FIG. 7 is a sectional view of a main portion of a piezoelectric resonator chip.

FIG. 7 is a sectional view of a piezoelectric resonator chip. The piezoelectric chip 101 comprises a piezoelectric chip plate 102 and a pair of electrode patterns 103 formed on the opposed two main surfaces 102a and 102b of the piezoelectric chip plate 102. The electrode patterns 103 comprise a lower layer 104 of chromium (Cr) or nickel chromium (NiCr) and a conductive layer 105 of gold (Au) or silver (Ag) of a high electric conductivity and a high density coated on the lower layer 104. The lower layer 104 is disposed directly on the piezoelectric chip plate 102 in order to securely join the electrode patterns 103 and the piezoelectric chip plate 102 and in order to reliably solder wires (not shown) to the electrode patterns 103.

Figure 8:
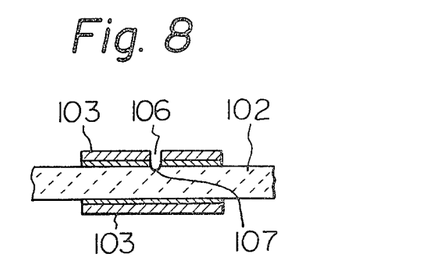
FIG. 8 is a sectional view of the piezoelectric resonator chip of FIG. 7, showing the state thereof after a laser beam is irradiated on one of the electrodes to trim it.

As FIG. 8 shows, when a laser beam is irradiated on the electrode patterns 103 of the resonator chip 101 so as to trim the electrode patterns 103 and thereby adjust the frequency, the laser beam penetrates the lower layer 104 so that the bottom 107 of the hole 106 formed by the laser beam reaches the piezoelectric chip plate 102 and a part of the piezoelectric chip plate is evaporated or cracked. This results in an increase of the equivalent series resistance $R_s$ of the resonator chip and in degradation of the quality factor Q. Therefore, the stability of the characteristic of the resonator chip and the accuracy of adjustment of the frequency are degraded.

A piezoelectric resonator in which the above drawbacks are obviated is described hereinafter.

Figure 9:
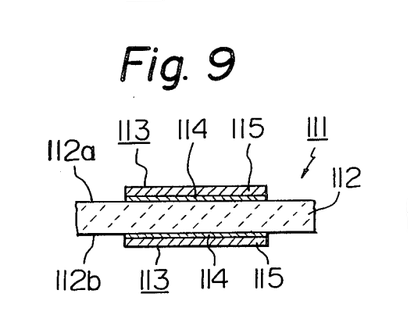
FIG. 9 is a sectional view of a main portion of another piezoelectric resonator chip according to an embodiment of the present invention.

In FIG. 9, a resonator chip 111 comprises a piezoelectric chip plate 112 of lithium tantalate and a pair of electrode patterns 113 formed on the opposed two main surfaces 112a and 112b of the piezoelectric chip plate. The electrode patterns 113 comprise a lower layer 114 of metal having a high melting point, such as tungsten (W), tantalum (Ta), or molybdenum (Mo), and a conductive layer 115 having a high electric conductivity, such as gold (Au) or silver (Ag), coated on the lower layer 114.

The boiling point of the metal of the lower layer 104 of the electrode patterns 103 of FIG. 7 is about equal to or lower than the boiling point of the metal of the conductive layer 105. On the other hand, the melting point of the metal of the lower layer 114 of the electrode patterns 113 of FIG. 9 is about equal to or higher than the boiling point of the metal of the conductive layer 115, as can be seen from the following table.

| Metal | | Melting Point (°C.) | Boiling Point (°C.) |
|---|---|---|---|
| High Melting- Point Metal | W | 3387 | 5927 |
| | Ta | 2996 | 5425 |
| | Mo | 2610 | 4804 |
| High Conductivity Metal | Au | 1064 | 2710 |
| | Ag | 962 | 2184 |

By using such metals, a sufficient laser energy for evaporation of the conductive layer 115 can be applied without evaporating the lower layer 114. Therefore, the hole 116 formed by a laser beam does not penetrate the lower layer 114, as is illustrated in FIG. 10.

Figure 10:
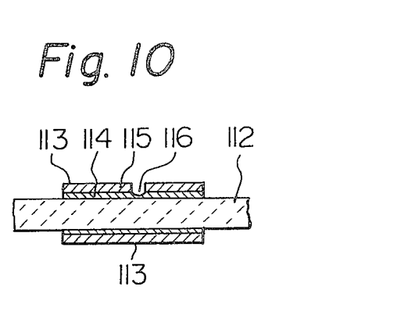
FIG. 10 is a sectional view of the piezoelectric resonator chip of FIG. 9, showing the state thereof after a laser beam is irradiated on one of the electrodes to trim it.

One of the experimental results was that the piezoelectric chip plate 112 of FIG. 9 was not damaged at all, as FIG. 10 shows, by a laser beam while the piezoelectric chip plate 102 of FIG. 7 was damaged by a laser beam, as FIG. 8 shows. The energy of the laser beam was such that the hole 106 of FIG. 8 was 10 $\mu$m in diameter and 10 $\mu$m in depth. Of course, the thickness of the conductive layer 115 was equal to that of the conductive layer 105 (about 1.5 $\mu$m), and the thickness of the lower layer 114 was equal to that of the lower layer 104 (about 500 Å).

Figure 11:
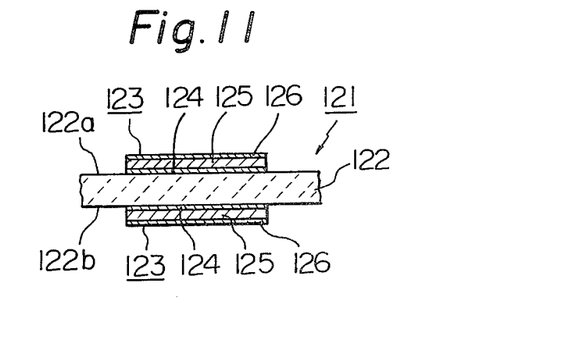
FIG. 11 is a sectional view of a main portion of another piezoelectric resonator chip according to another embodiment of the present invention.

In FIG. 11, a resonator chip 121 comprises a piezoelectric chip plate 122 and a pair of electrode patterns 123 formed on the opposed two main surfaces 122a and 122b of the piezoelectric chip plate 122. The electrode patterns 123 comprise a lower layer 124 of a metal having a high melting point, a conductive layer 125 of a metal having a high conductivity coated on the lower layer 124, and an antireflection layer 126 for preventing reflection of a laser beam. The antireflection layer 126 is composed of a metal such as chromium (Cr) or chromium oxide (CrO) having a high ability to absorb infrared rays. A metal having a high conductivity, such as gold, silver, or platinum, greatly reflects infrared rays. For example, the absorption factor of gold with respect to infrared rays having a 1.06$\mu$ wavelength is only 1%. Therefore, the energy of the laser beam is not effectively used for evaporation of the conductive layer. Also, the conductive layer is not uniformly evaporated since the reflection factor is not uniform due to the unevenness of the conductive layer surface.

Such drawbacks are obviated by disposing the antireflection layer 126 on the conductive layer 125. The antireflection layer 126 comprising, e.g., chromium, which has an absorption factor of 99% with respect to infrared rays having a 1.06$\mu$ wave-length.

A layer of Cr or NiCr similar to the lower layer 104 of FIG. 7 may be disposed between the piezoelectric chip plate 112 or 122 and the lower layer 114 or 124 so as to securely join the electrode patterns 113 or 123 and to the piezoelectric chip plate 112 or 122.

Figure 12:
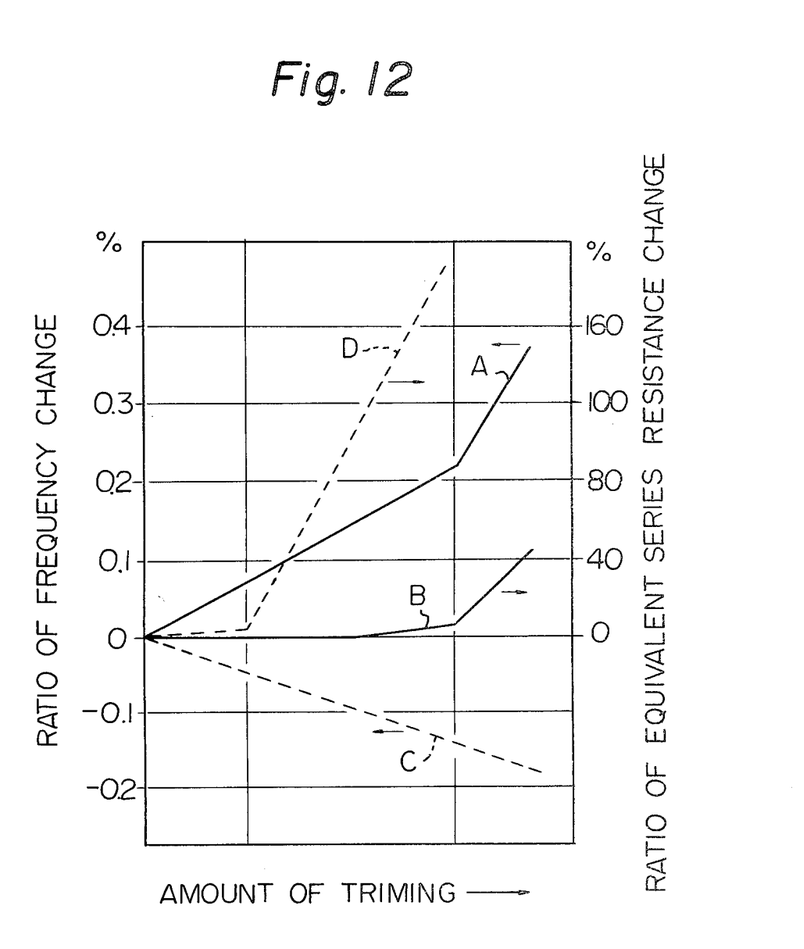
FIG. 12 is a graph of the ratio of resonant frequency change and the ratio of equivalent series resistance change with respect to the amount of trimming with a laser beam.

In FIG. 12, the abscissa represents the amount of trimming of the resonator chip with a laser beam, the left ordinate represents the ratio of frequency (f) change, and the right ordinate represents the ratio of equivalent series resistance ($R_s$) change. Line A shows the ratio of frequency (f) change of a resonator having a lower layer of a high melting point metal. Line B shows the ratio of an equivalent series resistance ($R_s$) change of a resonator having a lower layer of a high melting point metal. Line C shows the ratio of frequency (f) change of a resonator not having a lower layer of a high melting point metal. Line D shows the ratio of equivalent series resistance ($R_s$) change of a resonator not having a lower layer of a high melting point metal.

As can be seen from FIG. 12, the frequency change ratio of line A is larger than that of line C and the frequency change ratio of line B is gradual as compared with that of line D. Regarding lines A and B, when the change ratio of $R_s$ is about 7%, the frequency change ratio is more than 0.2%. The change ratio of $R_s$ of line D sharply rises from a ratio of about 4%. Regarding lines C and D, when the change ratio of $R_s$ is about 7%, the frequency change ratio is about 0.05%. The adjustable range of frequency of the resonator represented by lines A and B is wider than that of the resonator represented by lines C and D. Regarding resonator lines A and B, the frequency is accurately adjusted as compared with the resonator of lines C and D.

Another method for avoiding damaging of the piezoelectric chip plate when a laser beam is irradiated, as is illustrated in FIG. 8, is described hereinafter.

Figure 13:
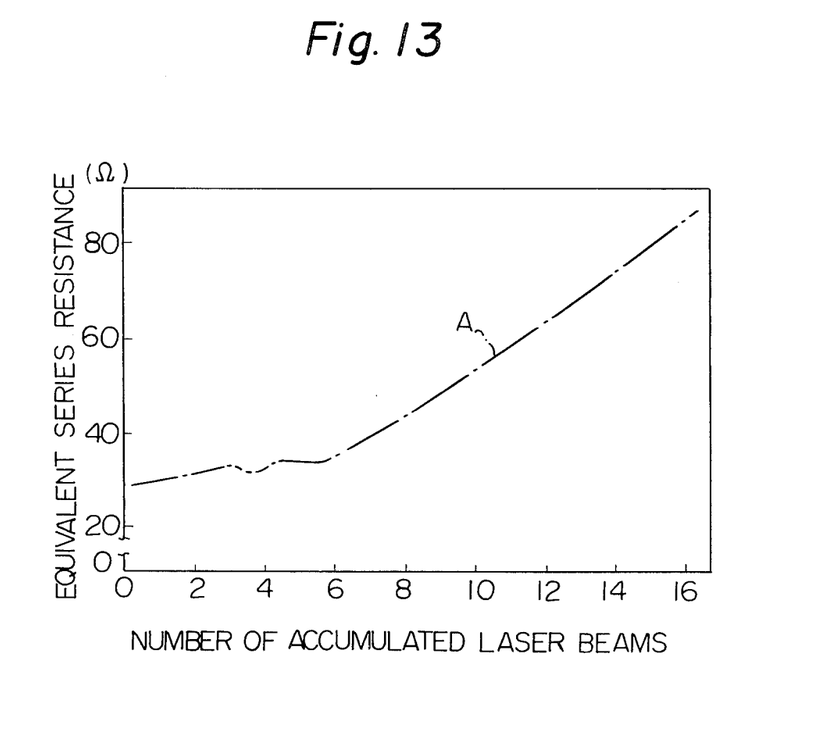
FIG. 13 is a graph of the equivalent series resistance $R_s$ with respect to the number n of accumulated laser beams irradiated on one of the electrodes during an experiment.

FIG. 13 is a graph of the relationship between the equivalent series resistance $R_s$ of the piezoelectric chip plate and the number n of accumulated laser beams irradiated on the electrode pattern of the piezoelectric chip plate. The ordinate represents the equivalent series resistance $R_s$ and the abscissa represents the number n of accumulated laser beams. The characteristic of $R_s$ is represented by line A. Line A shows that $R_s$ is about 25 Ω when n=0 while $R_s$ is increased to about 85 Ω when n=160.

Figure 14:
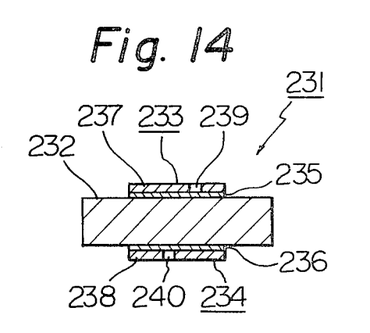
FIG. 14 is a sectional view of a piezoelectric resonator chip showing the state thereof after a laser beam is irradiated thereon in accordance with the method of the present invention.

In FIG. 14, a resonator chip 231 comprises a piezoelectric chip plate 232 and a pair of electrode patterns 233 and 234 formed on the opposed two main surfaces. The electrode patterns 233 and 234, respectively, comprise lower layers 235 and 236 of NiCr or Cr and conductive layers 237 and 238 coated on the lower layers 235 and 236. The resonant frequency of the resonator chip is adjusted by removing a part of the electrode patterns 233 and 234 by irradiating a laser beam. The luminous intensity of the laser beam is such that the laser beam evaporates only the conductive layers 237 and 238 and not the lower layers 235 and 236. Therefore, the holes 239 and 240 formed by laser beam do not penetrate the lower layers 235 and 236.

Figure 15:
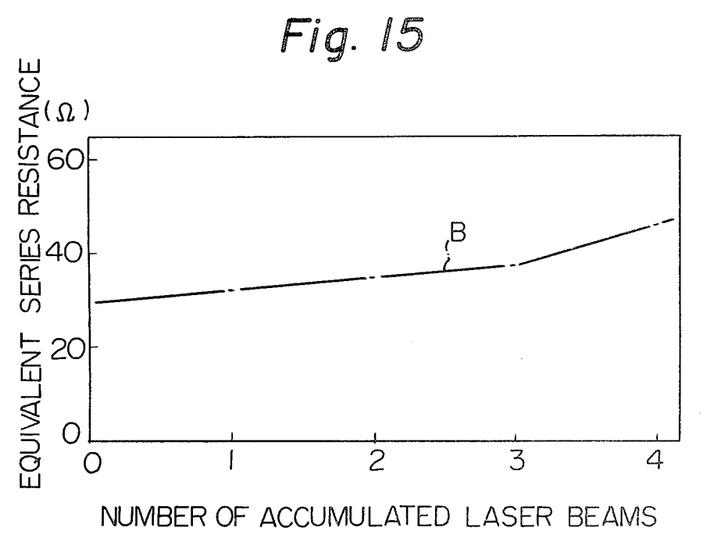
FIG. 15 is a graph showing the equivalent series resistance $R_s$ with respect to the number n of accumulated laser beams irradiated on one of the electrodes during another experiment.

In FIG. 15, the ordinate represents the equivalent series resistance $R_s$ and the abscissa represents the number n of accumulated laser beams. Line B shows the relationship between $R_s$ and n. The increase rate of line B is gradual as compared with that of line A of FIG. 13. Line B also shows that $R_s$ is about 29 Ω when n=0 and increases only to 37 Ω (the increase ratio is about 28%) even when n=3000.

Line A of FIG. 13 and line B of FIG. 15 represent the results of an experiment in which the resonator chip of line A was the same as that of line B and the diameter of the hole formed by the laser beam of line A was the same as that of the hole formed by the laser beam of line B. As can be seen from the graph of line B as compared with the graph of line A, a large amount of the conductive layer of the electrode pattern can be removed with a small increase of the equivalent series resistance $R_s$ by appropriately weakening the luminous intensity of the laser beam according to the present invention.

Usually, the conductive layer of the electrode pattern is made of Au. The reflection factor of Au with respect to a laser beam is more than 99.9%. Therefore, the energy of the laser beam is not effectively used for forming a hole in the electrode pattern. It is especially useful, if a weakened laser beam is used, to increase the absorption ability of the laser beam or the functional efficiency of the laser beam. The absorption ability can be increased by forming the conductive layer from Au-black, which is coated on the chip plate by the evaporation of the Au in a vacuum atmosphere of $N_2$ of several mmHg. The functional efficiency of the laser beam can be enhanced by forming an uneven surface of the electrode pattern by the conventional inclined evaporation method so that a diffused reflection of the laser beam on the uneven surface of the electrode pattern takes place.

Figure 16:
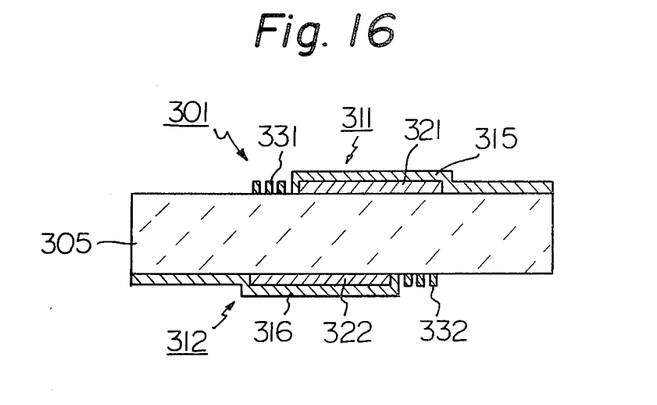
FIG. 16 is a sectional view of the piezoelectric resonator chip according to another embodiment of the present invention.

Another embodiment of the present invention is illustrated in FIG. 16. As mentioned before, in the resonator chip having a pair of electrode patterns, each comprising a comb-shaped adjuster electrode at an end of the main portion of the electrode pattern, a precise adjustment of the frequency can be conducted by removing part of the main portion of the electrode pattern by irradiating a laser beam thereupon as well as a rough adjustment of the frequency by cutting the comb-shaped adjuster electrode. In such a case, if a layer of a high melting point metal is disposed under the comb-shaped electrode, the laser beam for separating the comb-shaped electrode must be intensified, resulting in damage of the piezoelectric chip plate. On the other hand, a layer of a high melting point metal should be disposed under the main portion of the electrode pattern so as to protect the piezoelectric chip plate from the laser beam in the precise adjustment process of the frequency. A construction of a resonator chip 301, taking these points into consideration, is illustrated in FIG. 16. Numerals 331 and 332 designate comb-shaped adjuster electrodes for rough adjustment of the frequency. These comb-shaped adjuster electrodes 331 and 332 are directly formed on the piezoelectric chip plate 305. Numerals 321 and 322 designate layers of a high melting point metal disposed under the main portions 315 and 316 of the electrode patterns 311 and 312.

As was mentioned above, in accordance with the present invention, the adjustable range of the resonant frequency is widened, thereby rendering manufacture of the resonator chip easy and increasing the reliability of the resonator.

Also, a stable characteristic of the equivalent series resistance and a mechanical quality factor Q can be obtained by the laser trimming method in accordance with the present invention, with the result that the resonant frequency can be easily adjusted.

Also, in accordance with the present invention, a stable characteristic of the resonator chip can be obtained not only due to the increase of the adjustable range of the resonance frequency but also by the laser trimming method in which the piezoelectric chip plate is not damaged by by the laser beam.

We claim:
1. A piezoelectric resonator chip comprising:
a piezoelectric chip plate having opposite surfaces;
a pair of electrode patterns formed on the opposite surfaces of said piezoelectric chip plate, respectively, said pair of electrode patterns facing each other through said piezoelectric chip plate, at least one of said pair of electrode patterns having a comb-shaped adjuster pattern comprising:
a narrow cutting pattern formed on one of said opposite surfaces of said piezoelectric chip plate; and
a separation pattern operatively connected to said at least one of said pair of electrode patterns through said narrow cutting pattern.
2. A piezoelectric resonator chip as set forth in claim 1, wherein said cutting pattern is a pattern cut by laser beam irradiation.
3. A piezoelectric resonator chip as set forth in claim 1 or 2, wherein said pair of electrode patterns comprise:
a metal layer having a high melting point and formed on said piezoelectric chip plate; and
a conductive layer formed on said metal layer.
4. A piezoelectric resonator chip as set forth in claim 1 or 2, further comprising an anti-reflection layer, for preventing reflection of a laser beam, formed on said pair of electrode patterns.

5. A piezoelectric resonator chip as set forth in claim 1 or 2, further comprising a layer of a high melting point metal, wherein said comb-shaped adjuster pattern is directly formed on said piezoelectric chip plate, and said layer of the high melting point metal is disposed between said pair of electrode patterns and said piezoelectric chip plate.

6. A method for forming a piezoelectric resonator chip including a piezoelectric chip plate having a top, a bottom and a center portion, comprising the steps of:
 (a) forming electrode patterns on the top and bottom of the piezoelectric chip plate, the electrode patterns having a main portion formed on the center portion of the piezoelectric chip plate;
 forming comb-shaped adjuster electrodes having connecting bridges which extend from the main portion;
 (c) trimming the connecting bridges of the comb-shaped adjuster electrodes to perform a rough frequency adjustment; and
 (d) trimming the main portions of the electrode patterns to perform a fine frequency adjustment.

7. A method for forming a piezoelectric resonator chip as set forth in claim 6, wherein said step (c) comprises the substeps of:
 (i) measuring a voltage applied between the electrode patterns; and
 (ii) trimming the connecting portions with a laser beam in accordance with the desired frequency; and wherein said step (d) comprises:
 (iii) trimming the remaining portions with the laser beam in accordance with the desired frequency.

8. A piezoelectric resonator chip as set forth in claim 3, further comprising an anti-reflection layer, for preventing reflection of a laser beam, formed on said pair of electrode patterns.

9. A method of trimming electrode patterns for adjusting the resonant frequency of a piezoelectric resonator chip which includes a piezoelectric chip plate having opposite surfaces, said method comprising the steps of:
 (a) forming a pair of electrode patterns, on the opposite surfaces of the piezoelectric chip plate, the pair of electrode patterns facing each other through the piezoelectric plate, comprising the substep of:
 (i) forming a comb-shaped adjuster pattern, on at least one of the electrode patterns, having a narrow cutting pattern and a separation pattern connected to the at least one of the electrode patterns through the narrow cutting pattern and facing the other electrode pattern; and
 (b) irradiating a laser beam onto the narrow cutting pattern so as to electrically separate the separation pattern from the at least one of the electrode patterns.

* * * * *

UNITED STATES PATENT AND TRADEMARK OFFICE
CERTIFICATE OF CORRECTION

PATENT NO. :   4,468,582
DATED      :   AUGUST 28, 1984
INVENTOR(S):   YOSHIRO FUJIWARA ET AL.

It is certified that error appears in the above-identified patent and that said Letters Patent is hereby corrected as shown below:

```
Col. 4, line 15, "1" should be --ℓ--;
        line 20, "1" should be --ℓ--;
        line 22, "1" should be --ℓ--;
        line 25, "1" should be --ℓ--;
        line 28, "1" should be --ℓ--;
        line 50, "1" should be --ℓ--;
        line 53, "1" should be --ℓ--;
        line 57, "1" should be --ℓ--.

Col. 6, line 34, "antire-" should be --anti-re- --.
```

Signed and Sealed this

Nineteenth Day of February 1985

[SEAL]

Attest:

DONALD J. QUIGG

Attesting Officer

Acting Commissioner of Patents and Trademarks